US010374393B2

(12) United States Patent
Bismuto et al.

(10) Patent No.: US 10,374,393 B2
(45) Date of Patent: Aug. 6, 2019

(54) QUANTUM CASCADE LASER WITH CURRENT BLOCKING LAYERS

(71) Applicant: Alpes Lasers SA, St-Blaise (CH)

(72) Inventors: Alfredo Bismuto, San Jose, CA (US); Jérôme Faist, Zürich (CH); Emilio Gini, Oberengstringen (CH); Borislav Hinkov, Vienna (AT)

(73) Assignee: Alpes Lasers SA, St-Blaise (CH)

( * ) Notice: Subject to any disclaimer, the term of this patent is extended or adjusted under 35 U.S.C. 154(b) by 0 days.

(21) Appl. No.: 15/532,805

(22) PCT Filed: Dec. 3, 2014

(86) PCT No.: PCT/IB2014/002666

§ 371 (c)(1),
(2) Date: Jun. 2, 2017

(87) PCT Pub. No.: WO2016/087888

PCT Pub. Date: Jun. 9, 2016

(65) Prior Publication Data

US 2017/0373473 A1 Dec. 28, 2017

(51) Int. Cl.
*H01S 5/12* (2006.01)
*H01S 5/22* (2006.01)
(Continued)

(52) U.S. Cl.
CPC .............. *H01S 5/3402* (2013.01); *H01S 5/12* (2013.01); *H01S 5/221* (2013.01); *H01S 5/2206* (2013.01);
(Continued)

(58) Field of Classification Search
CPC .... H01S 5/2206; H01S 5/2234; H01S 5/3402; H01S 5/3401; H01S 5/221; H01S 5/2211; H01S 5/2222–2228; H01S 5/2219
See application file for complete search history.

(56) References Cited

U.S. PATENT DOCUMENTS 5,148,439 A * 9/1992 Wunstel .................. H01S 5/227 372/45.01
5,311,534 A * 5/1994 Mori ...................... B82Y 20/00 372/45.01
(Continued)

FOREIGN PATENT DOCUMENTS

EP 0314372 A2 * 5/1989 ............. H01S 5/227
EP 0544439 A1 * 6/1993 ............. B82Y 20/00
(Continued)

OTHER PUBLICATIONS

International Search Report for corresponding International Application No. PCT/IB2014/002666 dated Jun. 10, 2015.
(Continued)

*Primary Examiner* — Joshua King
(74) *Attorney, Agent, or Firm* — Renner, Otto, Boisselle & Sklar, LLP

(57) ABSTRACT

Semiconductor Quantum Cascade Lasers (QCLs), in particular mid-IR lasers emitting at wavelengths of about 3-50 μm, are often designed as deep etched buried heterostructure QCLs. The buried heterostructure configuration is favored since the high thermal conductivity of the burying layers, usually of InP, and the low losses guarantee devices high power and high performance. However, if such QCLs are designed for and operated at short wavelengths, a severe disadvantage shows up: the high electric field necessary for such operation drives the operating current partly inside the insulating burying layer. This reduces the current injected into the active region and produces thermal losses, thus degrading performance of the QCL. The invention solves this problem by providing, within the burying layers, effectively designed current blocking or quantum barriers of, e.g. AIAs, InAIAs, InGaAs, InGaAsP, or InGaSb, sandwiched between the usual InP or other burying layers, intrinsic or Fe-doped. These quantum barriers reduce the described
(Continued)

Embodiment A negative effect greatly and controllably, resulting in a QCL operating effectively also at short wavelengths and/or in high electric fields.

7 Claims, 4 Drawing Sheets

(51) Int. Cl.
*H01S 5/34* (2006.01)
*H01S 5/227* (2006.01)
*H01S 5/343* (2006.01)

(52) U.S. Cl.
CPC .......... *H01S 5/2207* (2013.01); *H01S 5/2209* (2013.01); *H01S 5/2219* (2013.01); *H01S 5/2224* (2013.01); *H01S 5/2226* (2013.01); *H01S 5/2227* (2013.01); *H01S 5/2275* (2013.01); *H01S 5/3401* (2013.01); *H01S 5/34306* (2013.01)

(56) References Cited

U.S. PATENT DOCUMENTS 5,442,649 A * 8/1995 Kokubo .................. H01S 5/223 372/46.014
5,604,764 A * 2/1997 Motoda .................. H01S 5/227 372/45.01
5,822,350 A * 10/1998 Nishimura ............ B82Y 20/00 372/45.013
5,847,415 A * 12/1998 Sakata .................. B82Y 20/00 257/102
6,300,153 B1 * 10/2001 Koui ...................... C30B 25/02 257/E21.108
6,463,088 B1 * 10/2002 Baillargeon ........... B82Y 20/00 372/46.01
6,665,325 B2 12/2003 Beck et al.
6,706,542 B1 * 3/2004 Geva .................. H01L 21/2205 257/E21.136
6,819,695 B1 * 11/2004 Akulova ............ H01L 21/2205 257/25
7,944,959 B2 * 5/2011 Maulini ................. B82Y 20/00 372/4
2001/0006527 A1 * 7/2001 Inoue .................... H01S 5/2231 372/45.01
2001/0038657 A1 * 11/2001 Kasukawa .............. H01S 5/223 372/46.01
2003/0021315 A1 * 1/2003 Beck ...................... B82Y 20/00 372/45.01
2003/0086462 A1 * 5/2003 Chan ....................... H01S 5/227 372/45.01
2003/0173571 A1 * 9/2003 Kish, Jr. ................ B82Y 20/00 257/85
2003/0174751 A1 * 9/2003 Faist ...................... B82Y 20/00 372/45.01
2004/0121500 A1 * 6/2004 Ketelsen ............. H01L 31/0203 438/39
2005/0173694 A1 * 8/2005 Mawst .................. B82Y 20/00 257/14
2007/0098031 A1 * 5/2007 Yang ...................... B82Y 20/00 372/45.012
2007/0280319 A1 * 12/2007 Sekiguchi ............. B82Y 20/00 372/45.01
2008/0219312 A1 * 9/2008 Sugiyama ............. B82Y 20/00 372/46.01
2008/0290358 A1 * 11/2008 Hiratsuka ............... H01S 5/227 257/98
2009/0052488 A1 * 2/2009 Sugiyama ............. B82Y 20/00 372/45.012
2009/0213890 A1 * 8/2009 Patel ...................... B82Y 20/00 372/45.012
2011/0090928 A1 * 4/2011 Kaida .................. H01S 5/2226 372/46.012
2012/0201263 A1 * 8/2012 Botez ..................... B82Y 20/00 372/45.01
2013/0182736 A1 * 7/2013 Hashimoto ............ H01S 5/343 372/45.012
2013/0195136 A1 * 8/2013 Takagi .................. H01S 5/2054 372/45.012
2013/0200492 A1 * 8/2013 Dosanjh ................. B82Y 20/00 257/547
2013/0329761 A1 * 12/2013 Hashimoto .......... H01S 5/3401 372/45.012
2015/0207298 A1 * 7/2015 Tsuji .................... H01S 5/2275 438/39
2015/0357793 A1 * 12/2015 Mori ..................... H01S 5/2275 372/44.01
2016/0294160 A1 * 10/2016 Hashimoto ............. H01S 5/227

FOREIGN PATENT DOCUMENTS

EP 3113305 A1 * 1/2017 ........... H01S 5/2227
GB 2323708 B * 3/1999 ............. B82Y 20/00
JP 06005975 A * 1/1994 ............. B82Y 20/00
JP 2747080 B2 * 5/1998 ............. H01S 5/227
JP 2008270614 A * 11/2008 ............. H01S 5/227

OTHER PUBLICATIONS

Guo Dingkai et al., "Electrical Derivative Measurement of Quantum Cascade Lasers", Journal of Applied Physics, American Institute of Physics, U.S. vol. 109, No. 4, Feb. 22, 2011, p. 43105, XP012147530.

* cited by examiner

Prior Art

Embodiment A

Embodiment C

QUANTUM CASCADE LASER WITH CURRENT BLOCKING LAYERS

BACKGROUND AND PRIOR ART

The present invention relates to semiconductor lasers, in particular to Quantum Cascade Lasers (QCLs) emitting in the IR spectral range, i.e. at wavelengths of 1 mm to 780 nm, especially in the mid IR range of 3-50 μm.

The mid-IR spectral range is important for sensing applications due to the large number of molecules showing fundamental resonances in this region. Quantum Cascade Lasers (QCLs) have become frequently used and efficient laser sources for such applications. Examples are Maulini U.S. Pat. No. 7,944,959 and Faist US patent application 2003/0 174 751. A QCL laser generating a mid-IR spectrum is also shown in Vurgaftman U.S. Pat. No. 8,290,011.

Typical lateral-guiding structures used to form waveguides for quantum cascade lasers (QCLs) are deep-etched ridge waveguides, shallow-etched ridge waveguides or deep buried heterostructure (BH) waveguides. For high power and high performance devices, the buried heterostructure configuration is favored since it presents a higher thermal conductivity of the InP burying layers and at the same time guarantees low losses. Beck U.S. Pat. No. 6,665,325 is an example.

More specifically, the current blocking in the case of the Fe-doped InP is guaranteed by the built-in potential present at the interface between the Fe-doped InP and the n-doped InP contact layer. Since Fe acts as a deep donor level in InP, it also actively helps to trap electrons and thus prevents leakage currents. The magnitude of the built-in potential can be controlled by adjusting the Fe-doping in the InP. Unfortunately the latter parameter is strongly connected to the growth parameters and the built-in potential is typically limited to 50-100 kV/cm. Typically in the case of QCLs operating in a high electric field, the current is therefore partially driven inside the insulating burying layers. This effect reduces the actual current injected into the laser active region and, at the same time, it dissipates heat and therefore degrades laser performance.

In addition, it is well known that the introduction of Fe impurities inside the burying layers creates defect states inside the semiconductor forbidden gap, see P. B. Klein et al., Phys. Rev. B 29, 1947 (1984): Time-dependent photoluminescence of InP:Fe. This levels present absorptions, especially in the 3-4 μm spectral range, preventing the production of buried-heterostructure laser devices in this range.

This spectral region however is of crucial interest for spectroscopy and sensing applications due to the presence of fundamental resonances of many molecules in this spectral region. One of the aims of the present invention is to overcome the above-mentioned limitation and devise a method for making BH lasers with low optical losses also in this spectral range.

However, it should be understood that the present invention is not limited to QCLs of this wavelength, but is generally applicable for QCLs across the spectral range, e.g. to any BH laser design, be it a QCL with multi-color emitters or any other BH laser.

BRIEF SUMMARY OF THE INVENTION

In principle, the present invention discloses a novel structure of deep etched buried heterostructure quantum cascade lasers, i.e. BH QCLs, by including specific quantum barriers into a structure of multiple different, potentially doped semiconductor layers as burying layers. Useful barrier materials include AlAs and InAlAs, InGaAs, InGaAsP, and InGaSb.

By introducing specific quantum barriers and modifying number, thickness, and/or doping of the various layers constituting the burying layers, the conductivity of the burying layer(s) can be adjusted; it can be reduced especially in the case of high applied fields.

The concept of the present invention is applicable to undoped/intrinsic InP as well as to Fe-doped InP as main structural component of the burying layer. Advantageously, the absence of Fe impurities in the burying layers allows the fabrication of high performance BH lasers even in the 3-4 μm spectral region without penalizing laser performance by introducting additional losses.

Details and further advantages of the invention will be shown in the following description of several examples which are illustrated in the appended drawings.

DETAILED DESCRIPTION OF SEVERAL EMBODIMENTS

The following description refers to the appended figures showing the prior art and some embodiments of the present invention.

Figure 1A:
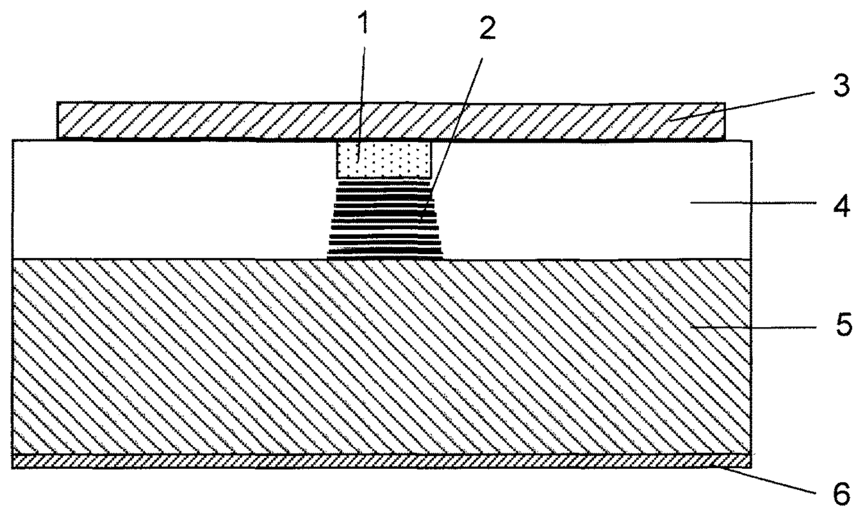
FIG. 1*a* a prior art buried heterostructure design.
Figure 1B:
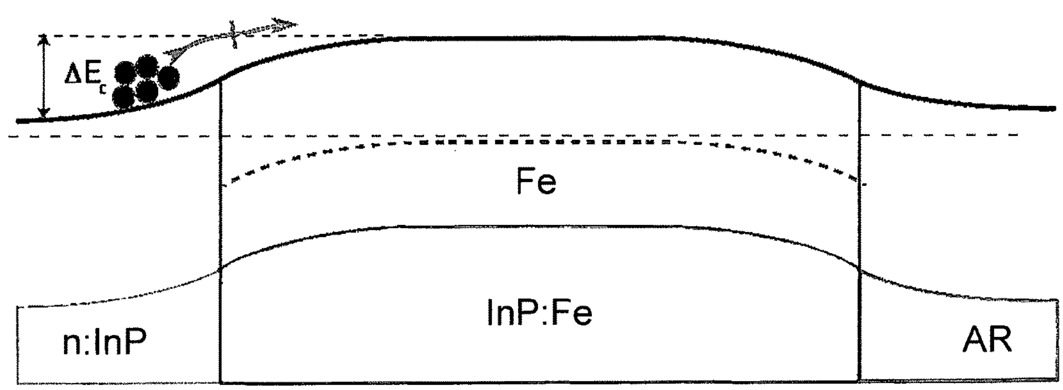
FIG. 1*b* the schematic band structure for the prior art design of FIG. 1*a*

FIGS. 1*a* and 1*b*, show schematically a prior art buried heterostructure quantum cascade laser, BH QCL, and the schematic band structure of an n:InP—InP:Fe-AR junction used in this prior art structure. AR stands for active region as usual.

In typical, prior art structures, a substrate 5, usually InP, with a rear or back electrode 6, usually of Au, carries on its top an active region (AR) 2, usually InGaAs/AlInAs, laterally confined by blocking or burying layers 4, i.e. Fe-doped InP or of Fe-doped InGaAs. A top electrode 3, usually also of Au, and an n-doped cladding 1, usually composed of InP and/or a ternary such as InAlAs or InGaAs, complete the structure.

Since the n-doped cladding 1 is a conductor, it has a leakage current into the lateral confining/blocking layers 4. This major problem with buried heterostructure devices is usually solved by using Fe impurities in the InP blocking layers as mentioned above.

The schematic band structure of the n:InP—InP:Fe-AR junction in this a prior-art design is shown in FIG. 1*b*. As mentioned, the number of charge carriers moving from the n-doped InP cladding 1 into the InP blocking layer 4 is reduced by introducing Fe doping in the latter. The thus formed n:InP—InP:Fe junction blocks the carrier leakage from the n:doped InP cladding 1 to the InP:Fe blocking layer(s) 4. Thus the current is confined and the plurality of carriers are injected into the active region (AR) 2.

In fact, the Fe creates deep donor states in InP, pinning the Fermi level in the middle of the semiconductor forbidden gap. The built-in potential at the interface between the n-doped cladding and the Fe-doped blocking layer(s) acts as a barrier to block the electrons. Unfortunately this built-in potential depends on the maximum Fe-doping that can be incorporated in the InP and thus cannot be increased arbitrarily. The maximum Fe that can be incorporated by epitaxial growth is strongly influenced by the growth temperature. Increasing the growth temperature results in higher Fe-doping levels due to the improved cracking of the Fe precursor molecules.

Unfortunately the growth of QCLs can be performed at temperatures sensibly lower than the ones necessary to obtain high Fe dopings. Thus, especially for highly strained structures, the temperature for growing the burying layers cannot be increased arbitrarily without degrading the quality of the active layers. Therefore the Fe doping is generally limited to values between 2 and 8×10e16 $cm^{-3}$, resulting in a blocking field between 50 and 100 kV/cm. This suffices to block electrons in QCLs emitting in the longer wavelength regions of the mid-IR range with operating fields generally smaller than 100 kV/cm. However this is insufficient for short wavelength QCLs, in particular for lasers emitting in the 3-5 μm range, where the operating field can exceed 100 kV/cm, resulting in a leakage current flowing through the burying layers.

Further, the growth of Fe-doped layers is strongly influenced by the so-called "background doping" of the machine used for the growth. This background doping is the number of carriers unintentionally added during the growth. InP e.g. is known to have the tendency to be slightly n-doped if grown "undoped". The amount of background doping depends on the equipment wherein the growth is performed, i.e. the growth chamber conditions. Additional precautions have to be taken to prevent any leakage path being introduced at the beginning of the epitaxial regrowth. This is e.g. described by O. Ostinelli et al. in "Growth and characterization of iron-doped semi-insulating InP buffer layers for Al-free GaInP/GaInAs high electron mobility transistors", published in the Journal of Applied Physics, vol. 108, no. 11, p. 114502, 2010.

To circumvent the problems mentioned above, the present invention introduces additional quantum barriers, constituted by AlInAs/AlAs, InGaAs, InGaAsP, or InGaSb, for example, that improve the blocking of electrons. These barriers block the carrier transport independently from their doping and therefore can be introduced without increasing the optical losses.

By modifying number and thickness of such quantum barriers, the conductivity inside the burying layer can be adjusted and/or reduced which makes such a QCL suitable for applied high electric fields.

A significant advantage is that the growth of such quantum barriers is completely independent of the doping and thus far less sensible to the growth conditions. As mentioned above, Fe-doping inside the burying layers is well known for introducing losses in the 3-5 μm spectral region due to the presence of the absorption lines of the levels Fe3+ and Fe2+. This prevents the fabrication of high performance lasers in an interesting spectroscopic window, i.e. for wavelengths that are of interest for many medical and sensing applications due to the presence of fundamental resonances of C—H, O—H and N—H bonds.

With the present invention, a novel technique to block the electrons in the burying layers is created. In particular, the number of "blocking" quantum barriers can be adjusted according to the operating field of the laser and independent of any Fe-doping.

Furthermore, the use of quantum barriers according to the invention is fully compatible with the use of Fe-doping to further reduce the conductance in the regions where this will not introduce additional optical losses in the laser.

To summarize, the present invention introduces a novel method for producing buried heterostructure quantum cascade lasers, which method is not limited by growth conditions, especially growth temperature, and which method can generate optical waveguides with low losses in the desired mid-IR spectral range.

The following description of several embodiments names certain materials, e.g. InP, both intrinsic (i:InP) and doped, especially Fe-doped (InP:Fe), and InAlAs, to be used when executing this invention. It should be clear that other materials as InGaAs, AlAs, InAs, InGaAsP, InAlGaAs and the like can replace those mentioned without departing from spirit and gist of this invention.

Three embodiments of the present invention are described in the following.

Embodiment A

This embodiment is a buried-heterostructure QCL emitting at 3.3 μm.

Figure 2A:
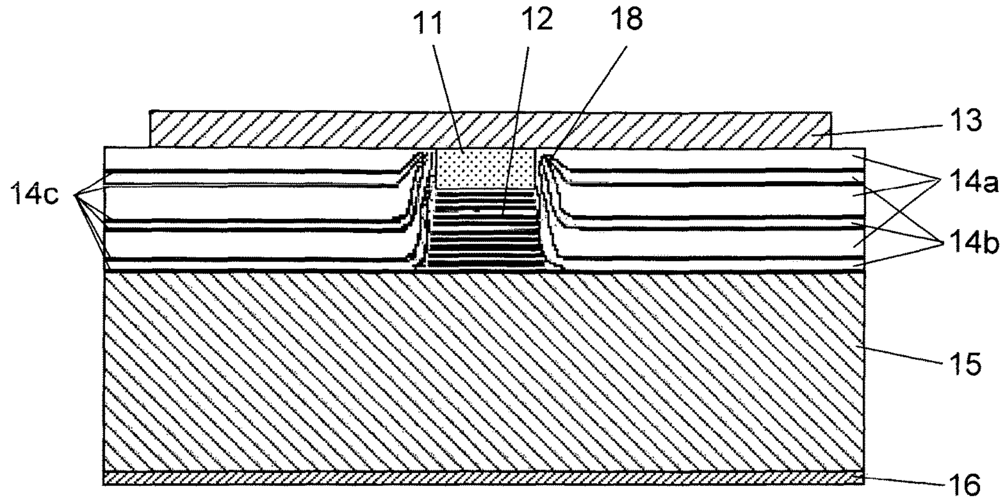
FIG. 2*a* a first embodiment according to the invention.

FIG. 2*a* shows this QCL with a layered arrangement, consisting of a couple of barriers confining the buried heterostructure. The structure consists of six quantum barriers of InAlAs embedded in layers of intrinsically undoped InP. This heterostructure provides the low loss waveguide and electron blocking sequence according to the invention. Its details are described in the following.

A substrate 15, here InP, with a rear or back electrode 16, usually of Au, carries on its top an active region 12 of InGaAs/InAlAs, laterally confined by a heterostructure 14*a*/14*b*/14*c*. This heterostructure comprises three groups of different layers. Each layer 14*a* consist of intrinsic or undoped i:InP and each layer 14*b* consist of a semiconductor, here i:InP or InGaAs. The third group are the barrier layers 14*c* of AlInAs; they are shown in FIG. 2*a* as thin layers in solid black.

Also shown in FIG. 2*a* are a top electrode 13, usually of Au, and an n-doped cladding 11 of InP and a ternary such as InAlAs or InGaAs. The sloped ends 18 of the barriers 14*a-c* are due to the epitaxial regrowth process taking place around the etched regions. They depend on the growth direction which is typically perpendicular to the etched surface.

Here are some approximate dimensions of the structure shown in FIG. 2*a*. The active region AR 12 is about 3 μm thick and 3-20 μm wide. The barrier heterostructure is about 6 μm thick, as is the active region AR 12 plus the cladding 11, which usually is a few μm, here 3 μm, thick.

The heterostructure of barrier layers is described in detail further down. The substrate 25 has a thickness of about 0.1-0.5 mm. The whole structure shown in FIG. 2*a* is about 2 mm long and 0.5 mm wide. Please note that these are just approximate dimensions; they vary depending on the preferred wavelength and/or the intended use of the device. Also, FIG. 2*a*, as all figures, are not to scale.

Figure 2B:
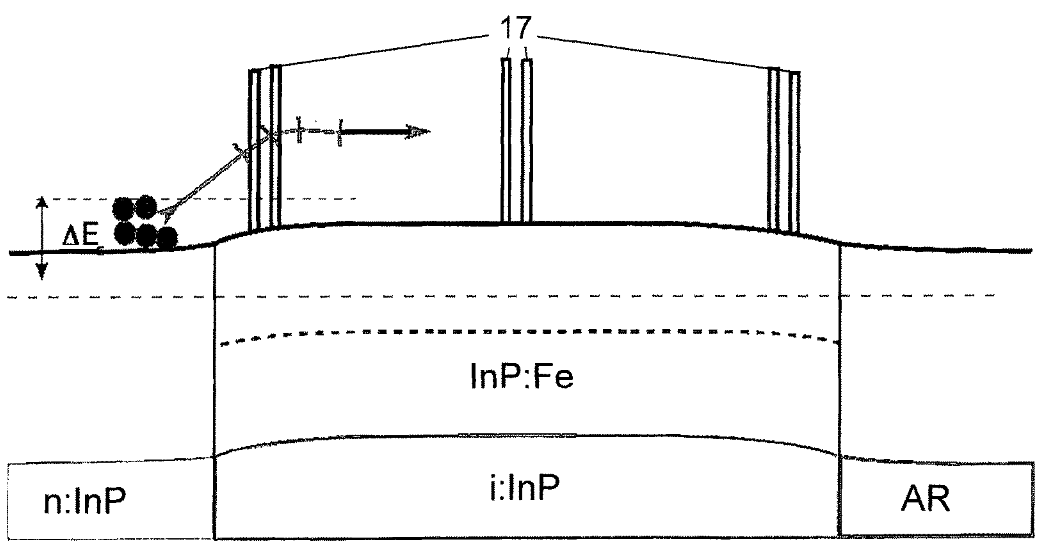
FIG. 2*b* the schematic band structure for the embodiment of FIG. 2*a*.

FIG. 2*b* displays a schematic band structure of the quantum barrier sequence of the QCL shown in FIG. 2*a*. Please note that "i:InP" or "i-InP" stands for intrinsic InP, i.e. undoped InP. The barrier layers 14*c* function as quantum barriers 17, whose positions can change as well as the number—six such barriers 14*c* are shown in FIG. 2*a*—reduce the electron transport without increasing the optical losses. It is important to understand that in embodiment A, by using the shown barriers, carrier leakage can be prevented even without using the InP:Fe.

The table below discloses the physical structure including the thicknesses of the quantum barriers 14*a-c*. By introducing these quantum barriers, the electrical conductivity of the heterostructure 14*a*/14*b*/14*c* is reduced without increasing the optical losses, as mentioned above.

The difference between the prior art burying or blocking layers as shown in FIG. 1*a* and the blocking layers according to the invention as depicted in FIG. 2*a* is obvious: whereas the prior art blocking layers consist throughout of Fe-doped InP, i.e. InP:Fe, the novel blocking layers according to the invention include a plurality of different layers including intrinsic/undoped InP.

The following table shows the dimensions of the confining layered heterostructure depicted in FIG. 2*a* with the quantum barriers 14*a-c* according to this embodiment A. Looking at the table below and at FIG. 2*a*, please note that "Start" defines the bottom of the heterostructure because this is where the regrowth is started. This means that the sequence shown in the table is reversed in the stack shown in FIG. 2*a*. Further, layers 14*b* may consist of intrinsic InP, i.e. i:InP as shown in the table, or InAlAs, as explained above. Thus, layers 14*a* and 14*b* may consist of different materials. Finally, as mentioned above, FIG. 2*a* is not true to scale, i.e. the sample dimensions and relations given in the table are not reflected in the figure. Please note that the barrier layers are shown in bold letters.

| Embodiment A<br>Top | |
|---|---|
| i:InP-14a | 100 nm |
| InAlAs-14c | 50 nm |
| i:InP or InGaAS-14b | 100 nm |
| InAlAs-14c | 50 nm |
| i:InP-14a | 600 nm |
| InAlAs-14c | 50 nm |
| i:InP or InGaAs-14b | 100 nm |
| InAlAs-14c | 50 nm |
| i:InP-14a | 600 nm |
| InAlAs-14c | 50 nm |
| i:InP or InGaAs-14b | 100 nm |
| InAlAs-14c | 50 nm |

Embodiment B

Embodiment B is another buried-heterostructure QCL emitting at 3.3 μm. Its overall dimensions are similar to the dimensions of Embodiment A.

However, to furthermore decrease the electrical conductivity for a given number of quantum barriers, Fe doping of the InP regions is partially reintroduced, but only far from the active region. In this case, Fe doping is only present close to the junction with the n-doped contact where the electrons are injected and not near the active region AR where the optical mode is relevant.

Figure 3A:
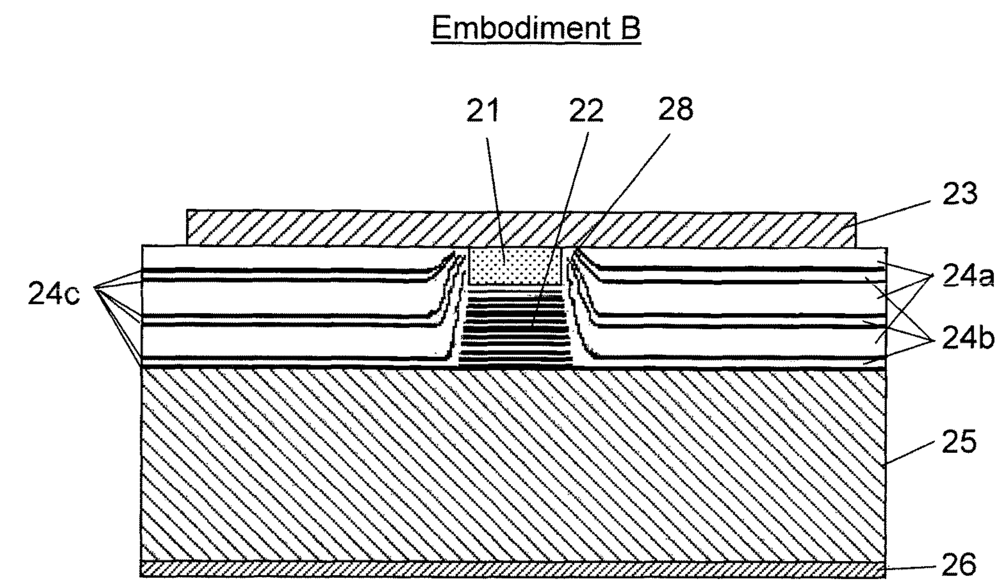
FIG. 3*a* a second embodiment according to the invention.

FIG. 3*a* shows this second embodiment according to the invention. The structure includes a substrate 25, here InP, with a rear or back electrode 26, usually of Au, a top electrode 23, usually also of Au, and a n-doped cladding 21, composed of InP and/or a ternary such as InAlAs or InGaAs on top of its active region 22 of InGaAs/InAlAs.

As in Embodiment A, the active region 22 is laterally confined on both sides by a barrier heterostructure with three groups of layers 24*a*/24*b*/24*c* of which the six layers 24*c* serve as blocking layers, consisting of InAlAs. As in Embodiment A, six quantum barriers 24*c* of InAlAs are used for electron blocking; further, the sloped ends 28 of the layers 24*c* are due to the epitaxial regrowth process taking place around the etched regions.

This Embodiment B differs from Embodiment A in that the five InP layers 24*a* and 24*b* closest to the electric contact 23 are doped with Fe, InP:Fe. Another difference to Embodiment A is a two-component burying layer 24*a* consisting of a deposit of Fe-doped InP, InP:Fe, and a deposit of intrinsic InP, i:InP, each of 300 nm thickness in the example shown.

Alternatively, all layers 24*a* and 24*b* in Embodiment B may be Fe-doped, i.e. consist of InP:Fe, whereby the Fe-doping level is reduced in the proximity of the active region 22.

Layers 24*b* may also consist of InGaAs instead of InP as in Embodiment A, FIG. 2*a*. Such InGaAs layers would be Fe-doped as explained above in connection with the respective InP layers. As mentioned, quantum barriers 24*c* confining or separating the burying layers 24*a* and 24*b*, consist of undoped InAlAs, again as in Embodiment A. So the difference to Embodiment A lies in the described Fe-doping of the layers 24*a* and *b* and the provision of at least one two-component burying layer 24*a* as mentioned above.

Figure 3B:
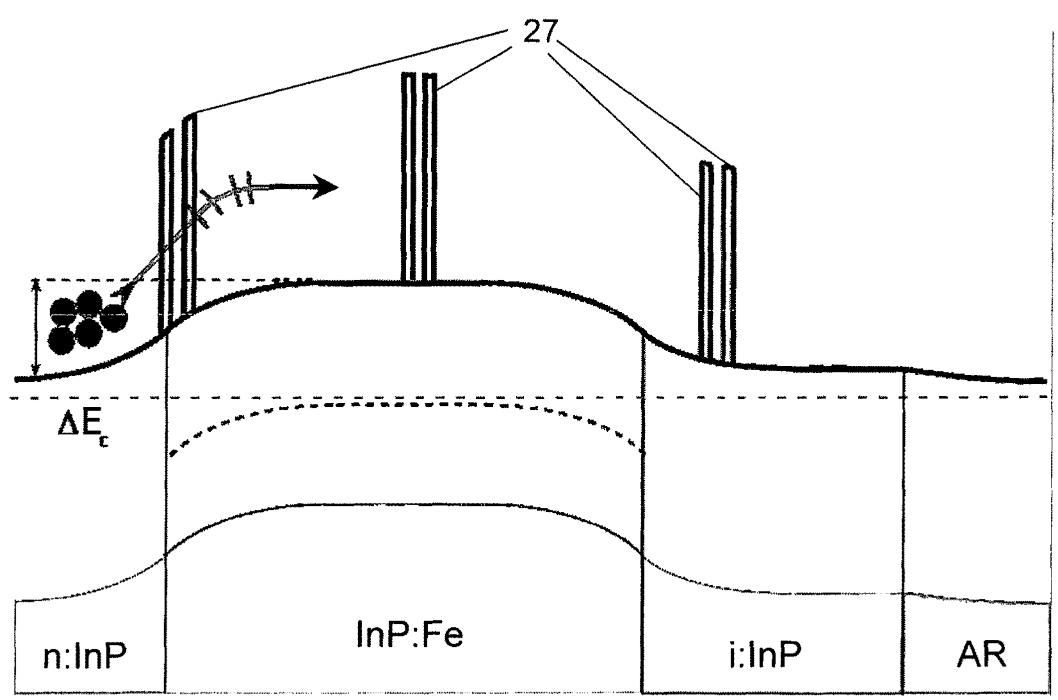
FIG. 3*b* the schematic band structure for the embodiment of FIG. 3*a*.

FIG. 3*b* displays a schematic band structure of the quantum barrier sequence of the QCL shown in FIG. 3*a*. In this case both the quantum barriers 24*c* and the Fe-doped layers 24*a* and 24*b* serve to block the carriers. The table below shows sample dimensions of a structure according to FIG. 3*a*:

| Embodiment B<br>Top | |
|---|---|
| InP:Fe-24a | 100 nm |
| InAlAs-24c | 50 nm |
| InP:Fe-24b | 100 nm |
| InAlAs-24c | 50 nm |
| InP:Fe-24a | 300 nm |
| i:InP-24a | 300 nm |
| InAlAs-24c | 50 nm |
| InP:Fe-24b | 100 nm |
| InAlAs-24c | 50 nm |
| i:InP-24a | 600 nm |
| InAlAs-24c | 50 nm |
| i:InP-24b | 100 nm |
| InAlAs-24c | 50 nm |

Embodiment C

This embodiment is a third buried-heterostructure QCL, a structure emitting at a wavelength of 4.3 μm with a high operating field to reduce electron leakage.

The basic structure of this embodiment is identical to the structure of Embodiment A, i.e. the confining layered barrier heterostructure comprises three groups of layers, a barrier group consisting of InAlAs, a second group of InP and a third group of either InP or InGaAs layers. The difference to the two aforementioned embodiments is that all InP or InGaAs layers are Fe-doped. Thus both the quantum barriers and the Fe doping serve to block the carriers which can be important and crucial for QCLs operating in a high electric field.

The following table shows structure and dimensions of this third embodiment:

| Embodiment C Top | |
|---|---|
| InP:Fe | 100 nm |
| InAlAs | 50 nm |
| InP:Fe | 100 nm |
| InAlAs | 50 nm |
| InP:Fe | 600 nm |
| InAlAs | 50 nm |
| InP:Fe | 100 nm |
| InAlAs | 50 nm |
| InP:Fe | 600 nm |
| InAlAs | 50 nm |
| InP:Fe | 100 nm |
| InAlAs | 50 nm |

Figure 4:
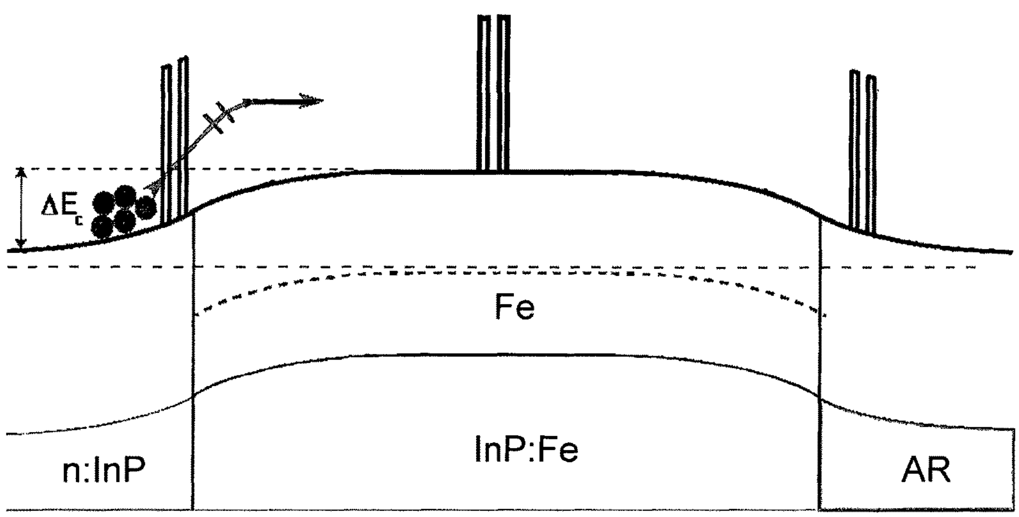
FIG. 4 the schematic band structure of a third embodiment.

FIG. 4 shows the schematic band structure of this third QCL embodiment according to the invention. Alternatively to the structure according to the table above, eight quantum barriers may be used for electron blocking in this case.

The above detailed description of the function and of various embodiments of the present invention permit a person skilled in the art to devise further implementations without departing from spirit and scope of the present invention.

The invention claimed is:

1. A semiconductor quantum cascade laser emitting at wavelengths in the mid-IR range, comprising a substrate, an active region, a cladding, at least two electrodes providing for current injection into said active region, and a buried heterostructure, wherein said heterostructure includes a stack of burying layers of about 100 nm to about 600 nm thickness consisting of one or more of the group of i:InP, InP:Fe, and InGaAs staggered alternatingly with of burying more than three barrier layers of about 50 nm thickness consisting of InAlAs not intentionally doped with oxygen.

2. The quantum cascade laser according to claim 1, wherein the buried heterostructure comprises a first number of barrier layers and a second number of burying layers.

3. The quantum cascade laser according to claim 2, wherein the first number and second number are both equal to six.

4. The quantum cascade laser according to claim 1, wherein at least one of the burying layers has a thickness greater than 100 nm.

5. The quantum cascade laser according to claim 1, comprising a buried heterostructure of the following structure:

| Top Electrode | |
|---|---|
| i:InP | 100 nm |
| InAlAs | 50 nm |
| i:InP or InGaAS | 100 nm |
| InAlAs | 50 nm |
| i:InP | 600 nm |
| InAlAs | 50 nm |
| i:InP or InGaAS | 100 nm |
| InAlAs | 50 nm |
| i:InP | 600 nm |
| InAlAs | 50 nm |
| i:InP or InGaAS | 100 nm |
| InAlAs | 50 nm. |

6. The quantum cascade laser according claim 1, comprising a buried heterostructure of the following structure:

| Top Electrode | |
|---|---|
| InP:Fe | 100 nm |
| InAlAs | 50 nm |
| InP:Fe | 100 nm |
| InAlAs | 50 nm |
| InP:Fe | 300 nm |
| i:InP | 300 nm |
| InAlAs | 50 nm |
| InP:Fe | 100 nm |
| InAlAs | 50 nm |
| i:InP | 600 nm |
| InAlAs | 50 nm |
| i:InP | 100 nm |
| InAlAs | 50 nm. |

7. The quantum cascade laser according to claim 1, comprising a buried heterostructure of the following structure:

| Top | |
|---|---|
| InP:Fe | 100 nm |
| InAlAs | 50 nm |
| InP:Fe | 100 nm |
| InAlAs | 50 nm |
| InP:Fe | 300 nm |
| InAlAs | 50 nm |
| InP:Fe | 100 nm |
| InAlAs | 50 nm |
| InP:Fe | 600 nm |
| InAlAs | 50 nm |
| InP:Fe | 100 nm |
| InAlAs | 50 nm. |

* * * * *